United States Patent [19]
Yoshihara et al.

[11] Patent Number: 5,140,178
[45] Date of Patent: Aug. 18, 1992

[54] RESET CIRCUIT FOR MICROCOMPUTER

[75] Inventors: Masahiro Yoshihara; Yoko Matsuzawa, both of Tokyo, Japan

[73] Assignee: Pioneer Electronic Corporation, Tokyo, Japan

[21] Appl. No.: 690,757

[22] Filed: Apr. 24, 1991

[30] Foreign Application Priority Data

Jul. 13, 1990 [JP] Japan ................................ 2-73896[U]

[51] Int. Cl.⁵ .......................................... H03K 17/20
[52] U.S. Cl. .................................. 307/272.3; 307/443
[58] Field of Search ................ 307/272.3, 592, 594, 307/597, 603, 279, 296.4, 443; 364/234, 266

[56]  References Cited
U.S. PATENT DOCUMENTS

| | | | |
|---|---|---|---|
| 4,433,390 | 2/1984 | Carp et al. | 307/272.3 X |
| 4,533,837 | 8/1985 | Tanaka et al. | 307/594 X |
| 4,572,966 | 2/1986 | Hepworth | 307/272.3 |
| 4,886,983 | 12/1989 | Taka | 307/272.3 X |
| 4,940,909 | 7/1990 | Mulder et al. | 307/272.3 X |
| 4,942,311 | 7/1990 | Harada | 307/272.3 |

Primary Examiner—David Hudspeth
Attorney, Agent, or Firm—Sughrue, Mion, Zinn, Macpeak & Seas

[57]  ABSTRACT

In an electric apparatus which accommodates a built-in microcomputer which is supplied with power at all times regardless of a state of switching of a main power switch for an electric apparatus, a reset circuit for the microcomputer wherein a key-on monitor monitors a duration of keying of a reset key and derives a detected signal therefrom at the time when the key is depressed continuously over a predetermined threshold time, and a reset signal generator generates a reset signal based on a detected output of the key-on monitor and resets the microcomputer for initialization. According to this reset circuit, the built-in microcomputer can readily be reset without disconnecting the main power supply, that is different from the conventional apparatus wherein the reset is performed by detaching the attachment plug from the receptacle.

8 Claims, 3 Drawing Sheets

५,140,178

RESET CIRCUIT FOR MICROCOMPUTER

BACKGROUND OF THE INVENTION

1. Field of the Invention

This invention relates to a reset circuit for microcomputers and more particularly, to a reset circuit for microcomputers installed in electric apparatuses.

2. Description of the Prior Art

Microcomputers are commonly installed in various electric apparatuses as controller units for controlling the operation thereof. Such a built-in microcomputer as installed in an electric apparatus implements various operational steps in accordance with a contained control program upon receipt of an external operator command or a signal detected by a sensor and the like. It is common to provide such electric apparatus with an auto-reset circuit for resetting the built-in microcomputer simultaneously with plugging an attachment plug of the apparatus in a receptacle in order to initiate the implementation of operational steps by the microcomputer from an initial step of the program.

An example of conventional auto-reset circuit is shown in FIG. 1, wherein the microcomputer is represented by a Central Processing Unit (CPU). Other peripheral devices, such as a RAM, ROM, I/O and the like are not shown so as to reduce circuit complexity.

When a power is supplied to the apparatus by plugging the attachment plug in the receptacle, operating voltages $V_{c1}$ and $V_{c2}$ are applied to the CPU 1 and auto-reset circuit, respectively. The operating voltage $V_{c1}$ charges a capacitor 202, which is used for a back-up voltage source, through a diode 201 and supplies an electric power to a collector of a transistor 204 through a resistor 203.

On the other hand, the voltage $V_{c2}$ is fed to a base of the transistor 204 through a differentiating circuit consisting of a resistor 205 and a capacitor 206. Accordingly, the transistor 204 is brought into conduction by a base current (or a charging current to the capacitor) that flows through the resistor 205 and the capacitor 206, and then a collector voltage becomes a low level "L" and which low level "L" is in turn fed to a reset terminal $\overline{\text{RESET}}$ of the CPU 1 as a reset signal.

The CPU 1 resets a built-in program counter, register and the like to an initial state automatically upon receiving the reset signal of low level "L".

The capacitor 206 is charged to its full after a certain period of time, passes and in turn the flow of the base current is stopped, causing the transistor 204 to turn off. Hence, the collector voltage of the transistor 204 is brought to a high level "H" from the low level "L", thus releasing the reset of the microcomputer.

As an example of the apparatus having a built-in microcomputer, there is a television receiver equipped with a remote controller. It is necessary for such television receiver to keep an operator command receiving circuit alive in order to receive a power on/off command or other required operator commands even if a main power switch is turned off. Therefore, as it is apparent from the operation of the remote controller, in the television receiver of the type described above, the microcomputer and other peripheral circuits that constitute the remote controller are supplied with power at all times regardless of a switching state, or on/off, of the main power switch for the television receiver for maintaining them in a stand-by condition in order to receive the operator commands.

Accordingly, to reset the built-in microcomputer for initialization in case of an abnormal operating condition of the apparatus such as a program runaway, a maintenance period or other cases as required, pulling the attachment plug from the receptacle disconnect the power supply from the apparatus, and plugging the attachment plug back in the receptacle once again has been the only way to reset the microcomputer. Thus, it has been troublesome to reset the microcomputer heretofore.

It is therefore an object of this invention to eliminate the problems encountered in the prior art and to provide a reset circuit for a built-in microcomputer wherein the microcomputer is reset easily without disconnecting the power supply to an apparatus.

SUMMARY OF THE INVENTION

In an electric apparatus which accommodates a built-in microcomputer, which is supplied with power at all times regardless of a state of switching, or on/off, of a main power switch for the electric apparatus, a reset circuit for the built-in microcomputer comprising, a key-on monitor for monitoring a duration of key-on of a specific key and deriving a detected signal therefrom at the time when the key is depressed continuously over a predetermined threshold time, and a reset signal generator for generating a reset signal based on a detected output of the key-on monitor and resetting the microcomputer for initialization.

Accordingly, In accordance with a reset circuit embodying the present invention, the built-in microcomputer can readily be reset without disconnecting the power supply, that is different from the conventional apparatus wherein the reset is implemented by detaching the attachment plug from the receptacle.

As a prescribed key for entering the reset command, a single purpose key may be provided independently, otherwise a key originally provided for operating another function may also be utilized for entering the reset command. In the latter case, since the reset command is discriminated based on the threshold time, the key operation for normal function having a short key-on time can readily be distinguished from the key operation having a long key-on time which is longer than the threshold time.

DETAILED DESCRIPTION OF THE PREFERRED EMBODIMENTS

Figure 1:
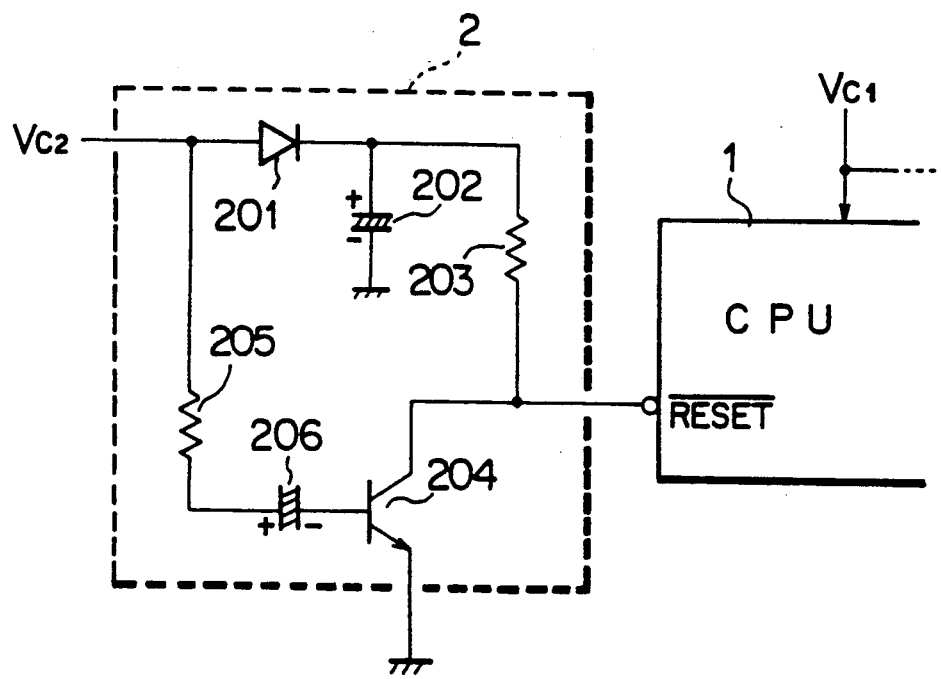
FIG. 1 is a circuit diagram showing a prior art reset circuit.
Figure 2:
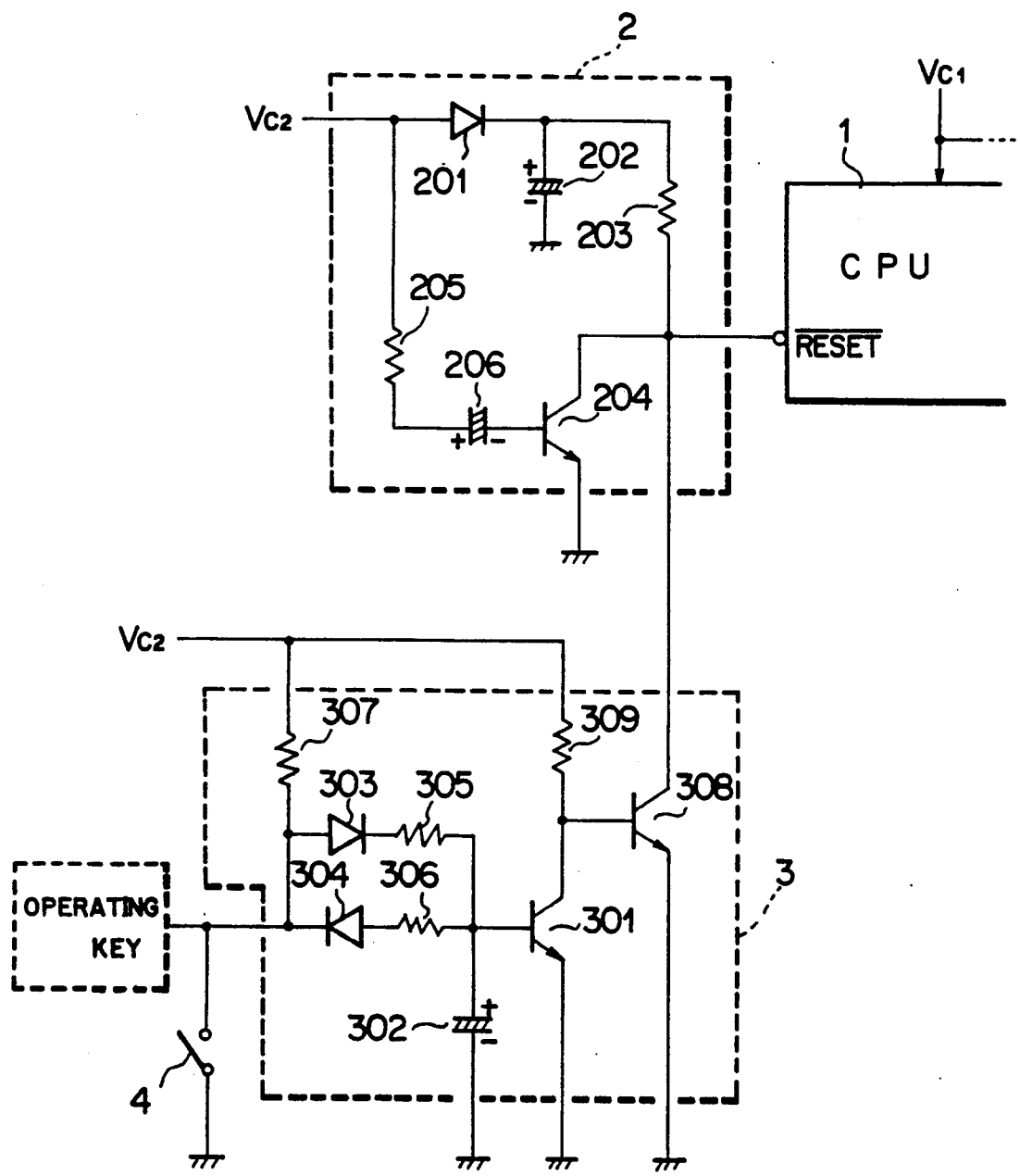
FIG. 2 is a circuit diagram showing an embodiment of this invention.

Referring now to the drawings, and particularly to FIG. 2, there is shown a circuit diagram illustrating a reset circuit embodying the present invention, wherein like numerals denote like elements of the prior art reset circuit of FIG. 1.

In FIG. 2, a block 3 shows the reset circuit in accordance with the present invention, wherein a circuit component consisting of a transistor 301, a capacitor 302, diodes 303 and 304, and resistors 305 through 307 constitutes a key-on monitor circuit for monitoring a key-on time of a reset key 4. A circuit component consisting of a transistor 308 and a resistor 309 constitutes a reset signal generator. A reset signal derived from a collector of the transistor 308 is fed to a reset terminal $\overline{\text{RESET}}$ of a CPU 1 together with a reset output of the conventional reset circuit 2.

In normal operating condition wherein the reset key 4 is not depressed, the capacitor 302 is charged by a source voltage $V_{c2}$ through a connection formed by the resistor 307, the diode 303, the resistor 305 and to the capacitor 302. Accordingly, a base voltage of the transistor 301 becomes equal to the source voltage $V_{c2}$ and the transistor 301 is in conduction, whereat a collector voltage of the transistor 301 is substantially equal to the ground potential and this ground potential is in turn applied on a base of the transistor 308 for turning off the transistor 308. This results in a high level "H" at a collector of the transistor 308 or the reset signal remains at the high level "H", therefore, the CPU 1 never be reset under this condition.

Upon depressing the reset key 4, the charge of the capacitor 302 is discharged through a connection formed by the resistor 306, the diode 304 and the reset key 4 with a time constant thereof, and then the base voltage of the transistor 301 decreases accordingly. If the terminal voltage of the capacitor 302 decreases less than a base-emitter voltage of the transistor 301 as by maintaining the depression of the reset key 4, the transistor 301 is turned over from "on" to "off" and detecting the reset command as it has given by the reset key 4.

When the transistor 301 is turned over to "off" as illustrated above, the transistor 308 is then turned over from "off" to "on" and the collector voltage of which becomes a low level "L". This low level "L" is in turn fed to the reset terminal $\overline{\text{RESET}}$ of the CPU 1 as the reset signal for initializing the CPU 1 by resetting. In this way, the CPU 1 can be reset for initialization simply by keeping on the depression of the reset key 4 over the predetermined threshold time without detaching the power source plug.

After completion of the resetting described above, the recharge of the capacitor 302 will start upon releasing the reset key 4. As soon as the capacitor 302 is recharged, the transistor 301 is turned on while the transistor 308 is turned off, thus terminating the transmission of the reset signal to the CPU 1.

In the first preferred embodiment of this invention described above, the threshold time for discriminating the reset command from other commands is determined by a time constant for discharging given by the capacitor 302 and resistor 306, and thereby the threshold time can be varied at discretion by varying the time constant. It is preferable to determine the threshold time to be a little longer time than a time required for normal keying, for example, several ten seconds, in order to discriminate the reset command from the conventional command attained by normal key press down.

Further, in the preferred embodiment of this invention described above, for simplifying the illustration, the single purpose reset key 4 has been adopted independently, however, an operating key originally mounted on the apparatus for the operation thereof may also be utilized as a reset key instead of providing the independent reset key 4, or may be simultaneously with the reset key 4, as it is shown by dotted line in the drawings. In this case, a specific operating key may be allotted for the reset key, or all operating keys may be allotted for the reset key, and thereby, in the latter case, if any of the whole operating keys is depressed for a duration longer than the threshold time, which depression will be recognized as a reset command.

Figure 3:
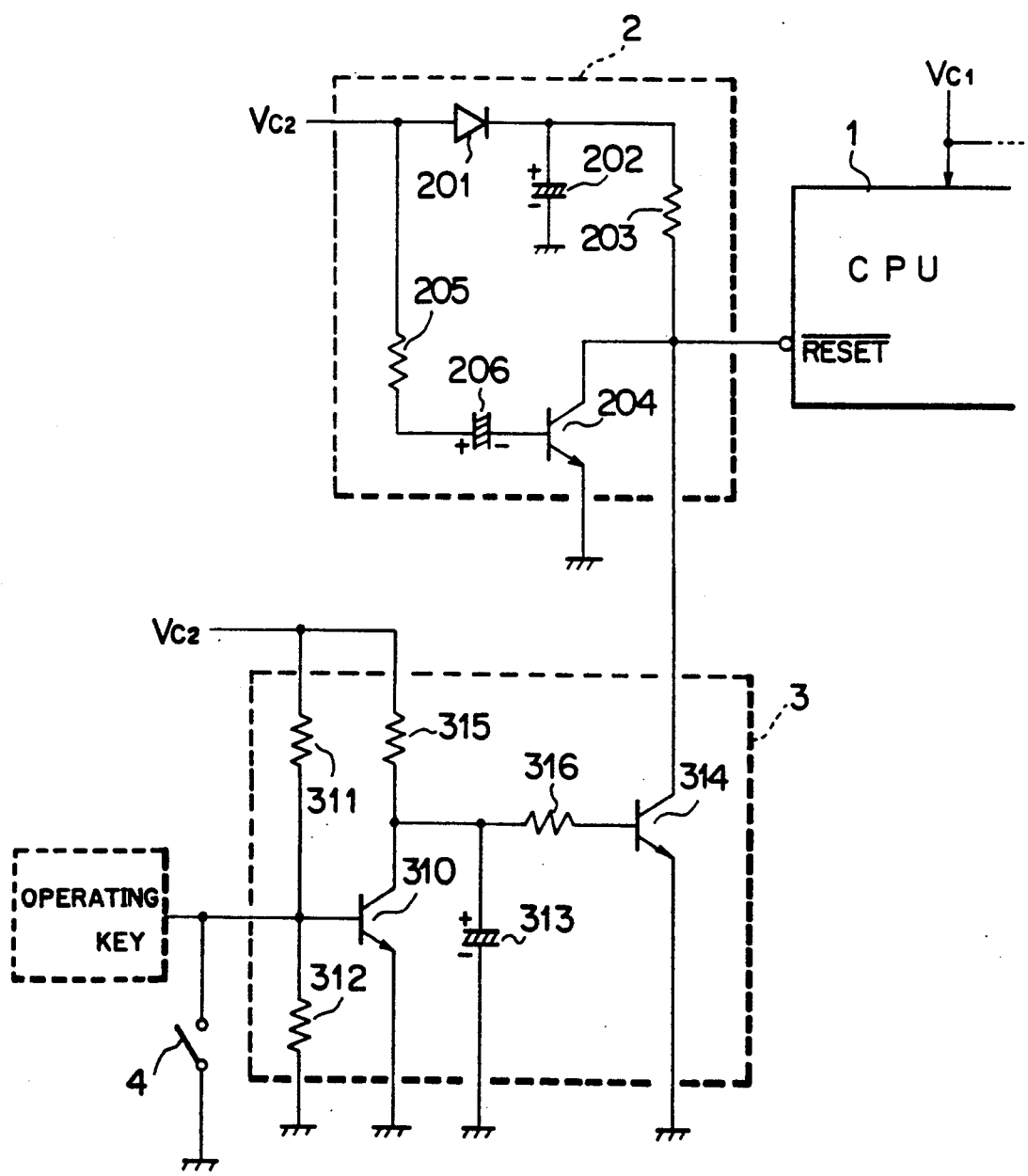
FIG. 3 is a circuit diagram showing another embodiment of this invention.

Referring now to FIG. 3, there is shown another embodiment of the present invention. According to this preferred embodiment, a key-on monitor and a reset signal generator are formed into one circuitry.

In normal operating condition wherein the reset key 4 is not depressed, a base of a transistor 310 is biased normally by means of biasing resistors 311 and 312, and the transistor 310 is kept in conduction, or turned on. Accordingly, a charged voltage of a capacitor 313, which is connected to the collector of the transistor 310 and to a base of a transistor 314 through a resistor 316, is kept at zero volts for turning off the transistor 314. A collector voltage of the transistor 314, or the reset signal, remains at a high level "H" and then no reset signal is fed to the CPU 1.

If the reset key 4 is depressed, the base of the transistor 310 is brought to the ground potential, and in turn the transistor 310 is turned off. Consequently, the capacitor 313 is charged gradually through a resistor 315 in accordance with a fairly large time constant given by the resistor 315 and capacitor 313. In this way, a base voltage of the transistor 314 increases its value gradually. When the charged voltage of the capacitor 313 exceeds the base-emitter voltage of the transistor 314 as a result of continuous depression of the reset key, a base current of the transistor 314 starts following through the resistor 316, thus resulting in the conduction of the transistor 314 or turn-over from "off" to "on". By the conduction of the above, a collector voltage of the transistor 314 becomes a low level "L" and this low level "L" is then fed to the reset terminal $\overline{\text{RESET}}$ of the CPU 1 as the reset signal, thus resulting in the initialization of the CPU 1.

After completion of the resetting described above, the capacitor 313 is discharged through the transistor 310 as it is turned on again upon releasing the reset key 4, and in turn the transistor 314 is turned off, thus terminating the transmission of the reset signal to the CPU 1.

In the second preferred embodiment of the present invention, the threshold time for discriminating the reset command from other commands is determined by a time constant given by the capacitor 313 and resistor 315. Accordingly, the threshold time can be varied at discretion merely by changing the time constant.

As it has been described above, in accordance with this invention, it is possible to reset the microcomputer contained in an electric apparatus without disconnecting the main power supply, that has been done in the prior art circuit, and provided is a simple way for handling the electric apparatus containing the microcomputer.

Further, in accordance with this invention, since the reset command is discriminated from other commands based on a length of continuation of key-on, an originally arranged operational key for operating the electric apparatus may also be used as the reset key for providing the built-in CPU with the reset signal.

It will be understood that the foregoing and other various changes may be made without departing from the spirit and scope of the present invention. Accordingly, the present invention is not to be considered to be limited to the specific embodiments illustrated, except insofar as may be required by the following claims.

What is claimed is:

1. In an electric apparatus containing a microcomputer wherein operating power is supplied to the microcomputer at all times regardless of main power supply to the electric apparatus, a reset circuit for the microcomputer comprising:

key-on monitor means for monitoring a duration of key-on of a prescribed key, wherein said monitor means detects the operation of said key when depression thereof continues over a threshold time, and said monitor means produres an output upon such detection; and reset signal generator means for generating a reset signal based on the output of said key-on monitor means, and for resetting the microcomputer.

2. A reset circuit for the microcomputer as defined in claim 1, wherein said key is an independent reset key.

3. A reset circuit for the microcomputer as defined in claim 1, wherein said key is incorporated with another operational key.

4. A reset circuit for the microcomputer as defined in claim 1, wherein said threshold time is determined by selecting a time constant for charging.

5. A reset circuit for the microcomputer as defined in claim 1, wherein said threshold time is determined by selecting a time constant for discharging.

6. A reset circuit for a microcomputer, comprising:
   (a) a monitor unit for producing an output signal in response to a key signal level held for a predetermined period of time; and
   (b) a reset signal generator, coupled to said monitor unit, said generator producing a reset signal to a microcomputer in response to said output signal.

7. The reset circuit of claim 6, further comprising:
   (c) a key manually operated to produce said key signal.

8. The reset circuit of claim 7, wherein said period of time is determined by selecting values of discrete components within said monitor unit.

* * * * *